US012721140B2

(12) United States Patent
Peng et al.

(10) Patent No.: US 12,721,140 B2
(45) Date of Patent: Aug. 25, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Liang-Hsuan Peng, Taipei (TW); Chih-Hung Lu, Hsinchu (TW); Chih-Lin Wang, Hsinchu (TW); Song-Bor Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 992 days.

(21) Appl. No.: 17/845,515

(22) Filed: Jun. 21, 2022

(65) Prior Publication Data

US 2023/0411279 A1 Dec. 21, 2023

(51) Int. Cl.
*H10W 20/42* (2026.01)
*H10W 20/00* (2026.01)

(52) U.S. Cl.
CPC ......... *H10W 20/42* (2026.01); *H10W 20/033* (2026.01); *H10W 20/056* (2026.01); *H10W 20/074* (2026.01); *H10W 20/081* (2026.01)

(58) Field of Classification Search
CPC ........... H01L 23/5226; H01L 21/76802; H01L 21/76829; H01L 21/76843; H01L 21/76877; H01L 21/76832; H01L 21/76834; H01L 23/53295; H10W 20/42; H10W 20/033; H10W 20/056; H10W 20/074; H10W 20/081; H10W 20/47; H10W 20/075; H10W 20/077
See application file for complete search history.

(56) References Cited

U.S. PATENT DOCUMENTS

| | | | | |
|---|---|---|---|---|
| 6,162,583 | A | 12/2000 | Yang et al. | |
| 10,049,950 | B2 | 8/2018 | Lim et al. | |
| 10,867,903 | B2 | 12/2020 | Kao et al. | |
| 2010/0301491 | A1 | 12/2010 | Yang | |
| 2015/0137350 | A1 | 5/2015 | Huang et al. | |
| 2019/0189563 | A1 | 6/2019 | Pietambaram et al. | |
| 2020/0105634 | A1* | 4/2020 | Huang | H01L 24/03 |
| 2021/0391413 | A1* | 12/2021 | Chen | H01L 24/20 |

(Continued)

OTHER PUBLICATIONS

U.S. Appl. No. 17/368,343, filed Jul. 6, 2021.

*Primary Examiner* — Thanh T Nguyen
(74) *Attorney, Agent, or Firm* — NZ Carr Law Office

(57) ABSTRACT

A semiconductor device structure, along with methods of forming such, are described. The structure includes an interconnect structure disposed over a substrate, a first conductive feature disposed in the interconnect structure, a dielectric layer disposed on the interconnect structure, and a second conductive feature having a top portion and a bottom portion. The top portion is disposed over the dielectric layer, and the bottom portion is disposed through the dielectric layer. The structure further includes an adhesion layer disposed over the dielectric layer and the second conductive feature. The adhesion layer includes a first portion disposed on a top of the second conductive feature and a second portion disposed over the dielectric layer, the first portion has a thickness, and the second portion has a width substantially greater than the thickness.

20 Claims, 16 Drawing Sheets

(56) References Cited

U.S. PATENT DOCUMENTS

2022/0165616 A1 5/2022 Liu et al.
2022/0246565 A1* 8/2022 Yang ........................ H01L 24/11
2022/0328614 A1* 10/2022 Hsiao ...................... H01L 24/03

* cited by examiner 100
140
138
130
124
122
120
116
128
126
118
106
112
104
102
114 110 108

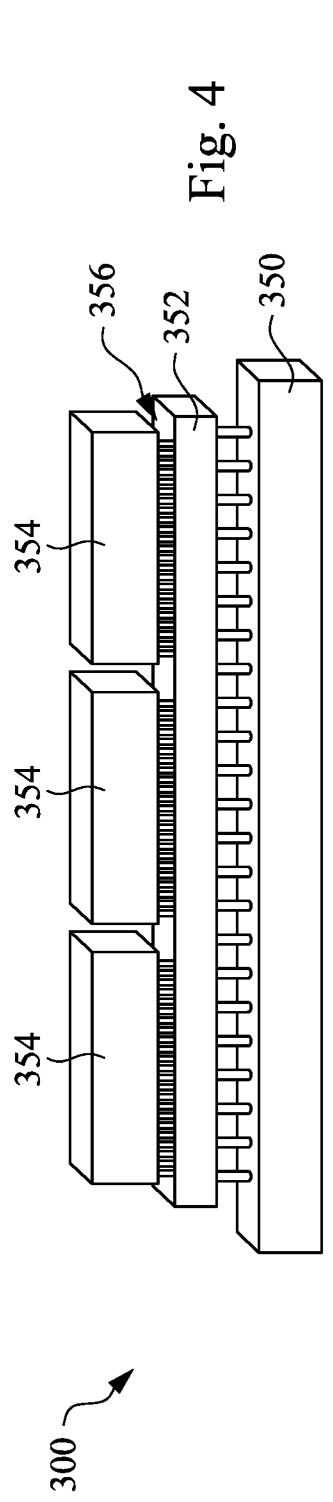
Fig. 4
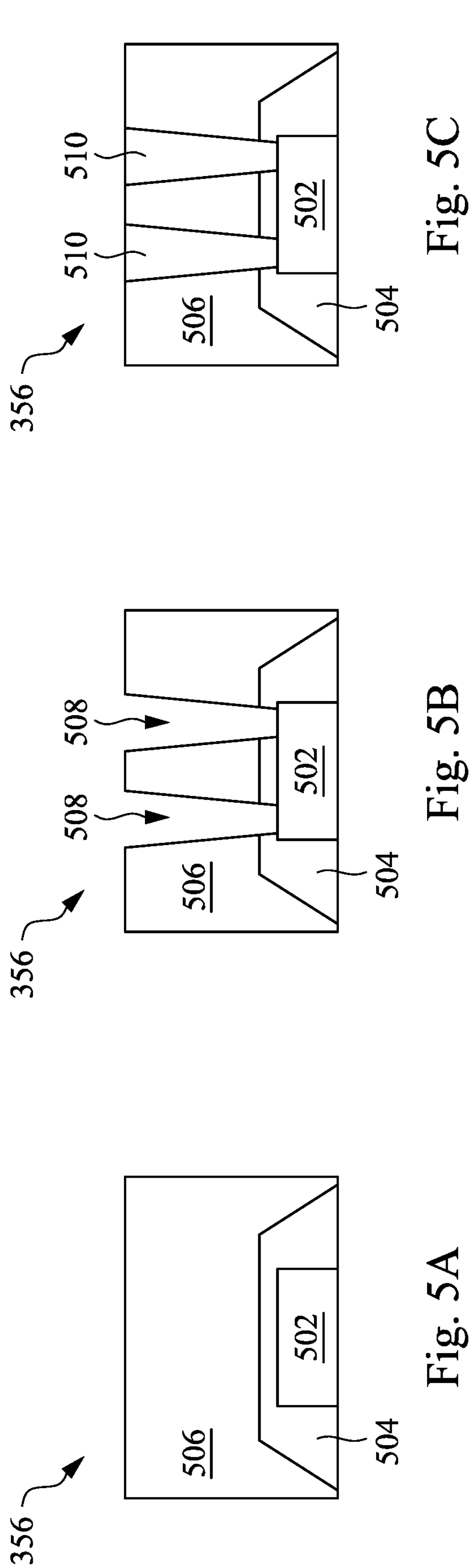
Fig. 5A
Fig. 5B
Fig. 5C

SEMICONDUCTOR DEVICE STRUCTURE AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a perspective view of a semiconductor package, in accordance with some embodiments.

FIGS. 5A-5C are cross-sectional side views of various stages of manufacturing an interconnect structure of the semiconductor package of FIG. 4, in accordance with some embodiments.

DETAILED DESCRIPTION

Figure 1A:
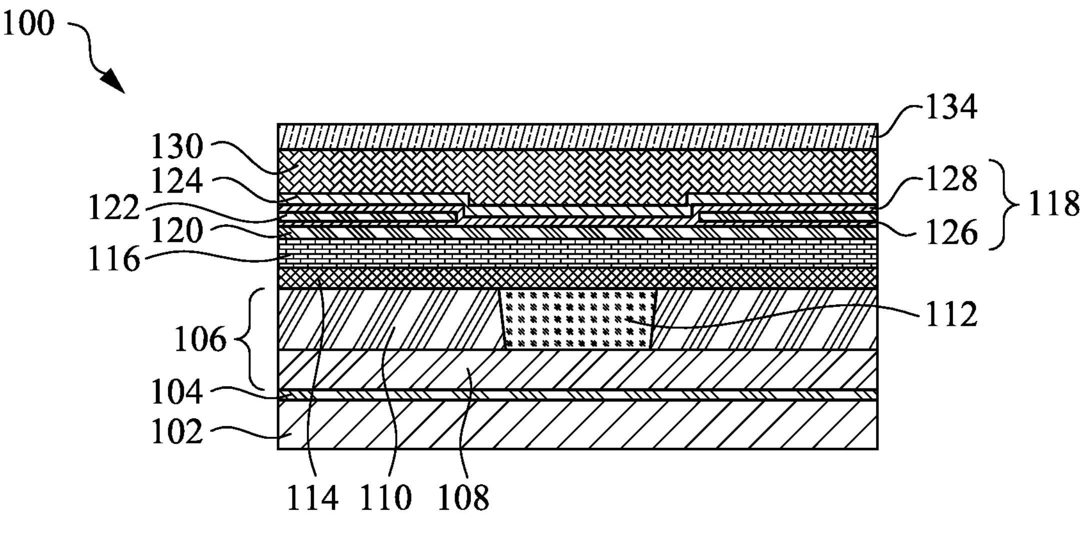
FIGS. 1A-1J are cross-sectional side views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “over,” “on,” “top,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated in different embodiments. Additional features can be added to the structure. Some of the features described below can be replaced or eliminated in different embodiments. Although some embodiments are discussed with operations performed in a particular order, these operations may be performed in another logical order.

FIGS. 1A-1J are cross-sectional side views of various stages of manufacturing a semiconductor device structure 100, in accordance with some embodiments. As shown in FIG. 1A, the semiconductor device structure 100 includes a substrate 102 and a device layer 104 formed on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include various regions that have been suitably doped with impurities (e.g., p-type or n-type impurities). The dopants are, for example phosphorus for an n-type fin field effect transistor (FinFET) and boron for a p-type FinFET.

The device layer 104 includes one or more devices, such as transistors, diodes, imaging sensors, resistors, capacitors, inductors, memory cells, or a combination thereof. In some embodiments, the devices are transistors, such as metal oxide semiconductor field effect transistors (MOSFETs), complementary metal oxide semiconductor (CMOS) transistors, bipolar junction transistors (BJTs), high voltage transistors, high frequency transistors, p-channel and/or n-channel field effect transistors (PFETs/NFETs), or other suitable transistors. The transistors may be planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. The devices in the device layer 104 may be formed by a front end of line (FEOL) process.

As shown in FIG. 1A, the semiconductor device structure 100 may further include an interconnection structure 106 disposed over the device layer 104 and the substrate 102. The interconnection structure 106 includes an intermetal dielectric (IMD) layer 108 and a plurality of conductive features (not shown) disposed in the IMD layer 108. The conductive features may be conductive lines and conductive vias. The interconnection structure 106 includes multiple levels of the conductive features, and the conductive features are arranged in each level to provide electrical paths to various devices in the device layer 104 therebelow. The conductive features may be made from one or more electrically conductive materials, such as metal, metal alloy, metal nitride, or silicide. For example, the conductive features are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layer 108 includes one or more dielectric materials to provide isolation functions to various conductive features. The IMD layer 108 may include multiple dielectric layers embedding multiple levels of conductive features. The IMD layer 108 is made from a dielectric material, such as $SiO_x$, $SiO_xC_yH_z$, or $SiO_xC_y$, where x, y and z are integers or non-integers. In some embodiments, the IMD layer 108 includes a dielectric material having a k value ranging from about 1 to about 5.

As shown in FIG. 1A, the interconnection structure 106 may further include a dielectric layer 110 and one or more conductive features 112 formed therein. The dielectric layer 110 may be the top layer of the interconnection structure 106. The dielectric layer 110 may include the same material as the IMD layer 108, and the conductive feature 112 may include the same material as the conductive features formed in the IMD layer 108. A barrier layer (not shown) may be disposed between the conductive feature 112 and the dielectric layer 110. The interconnection structure 106 may be formed by a back end of line (BEOL) process.

An etch stop layer 114 may be disposed on the interconnection structure 106, as shown in FIG. 1A. The etch stop layer 114 may include SiC, SiN, SiCN, SiOC, SiOCN, a metal oxide, a metal nitride, or other suitable material. A dielectric layer 116 is disposed on the etch stop layer 114, a metal-insulator-metal (MIM) structure 118 is disposed on the dielectric layer 116, and a passivation layer 130 is disposed on the MIM structure 118. The dielectric layer 116 may include the same material as the IMD layer 108. In some embodiments, the dielectric layer 116 has a thickness ranging from about 300 nm to about 500 nm.

The MIM structure 118 includes a first electrode layer 120, a second electrode layer 122 disposed over the first electrode layer 120, and a third electrode layer 124 disposed over the second electrode layer 122. The first, second, and third electrode layers 120, 122, 124 may include an electrically conductive material, such as a metal or a metal nitride. In some embodiments, the first, second, and third electrode layers 120, 122, 124 may include Al, Cu, W, Ti, Ta, TiN, TaN, or other suitable electrically conductive material.

The MIM structure 118 further includes a dielectric layer 126 disposed between the first and second electrode layers 120, 122, and a dielectric layer 128 is disposed between the second and third electrode layers 122, 124. The dielectric layers 126, 128 may include a high-k dielectric material having a k value greater than about 7. In some embodiments, the dielectric layers 126, 128 include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or other suitable material. In some embodiments, as shown in FIG. 1A, the second electrode layer 124 is not continuous, and a portion of the MIM structure 118 may include the dielectric layers 126, 128 disposed between the first electrode layer 120 and the third electrode layer 124.

The passivation layer 130 is disposed over the MIM structure 118. The passivation layer 130 may include an oxide or SiN. In some embodiments, the passivation layer 130 includes the same material as the dielectric layer 116. In some embodiments, the thickness of the passivation layer 130 may be greater than or equal to the thickness of the dielectric layer 116. For example, the thickness of the passivation layer 130 may range from about 350 nm to about 550 nm.

A mask layer 134 is disposed on the passivation layer 130. The mask layer 134 may include one or more layers. In some embodiments, the mask layer 134 includes a nitride, such as TiN. The mask layer 134 may be patterned by a patterned resist layer (not shown) formed on the mask layer 134. The pattern of the patterned resist layer may be transferred to the mask layer 134, which is then transferred to the layers disposed under the mask layer 134.

Figure 1B:
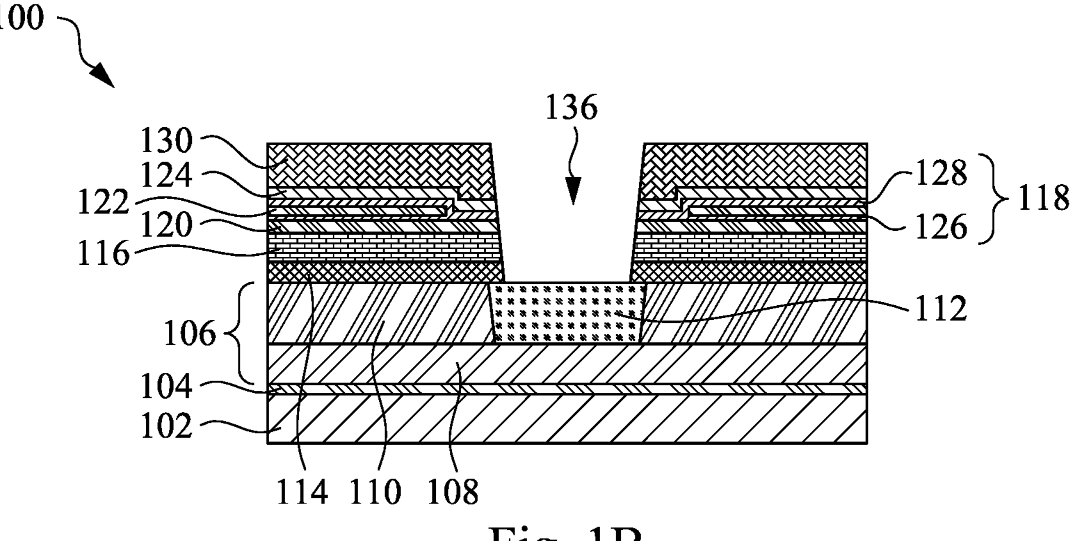

As shown in FIG. 1B, an opening 136 is formed in the passivation layer 130, the MIM structure 118, the dielectric layer 116, and the etch stop layer 114 to expose the conductive feature 112. The opening 136 may be formed by one or more etch processes. For example, a first etch process may be performed to remove a portion of the mask layer 134 (FIG. 1A) to expose a portion of the passivation layer 130, a second etch process may be performed to remove the exposed portion of the passivation layer 130 to expose a portion of the MIM structure 118, a third, fourth, and fifth etch processes may be performed to remove the exposed portion of the MIM structure 118 (the first and third electrode layers 120, 124 and the dielectric layers 126, 128) to expose a portion of the dielectric layer 116, a sixth etch process may be performed to remove the exposed portion of the dielectric layer 116 to expose a portion of the etch stop layer 114, and an seventh etch process may be performed to remove the exposed portion of the etch stop layer 114 to expose the conductive feature 112. More or less etch processes may be performed to form the opening 136. The etch processes may be dry etch processes, wet etch processes, or combinations thereof. In some embodiments, the portions of the mask layer 134 (FIG. 1A), the passivation layer 130, the MIM structure 118, the dielectric layer 116, and the etch stop layer 114 are removed by one or more dry etch processes. The mask layer 134 may be removed as a result of the multiple etch processes. In some embodiments, the opening 136 is a via opening.

Figures 1C, 1D:
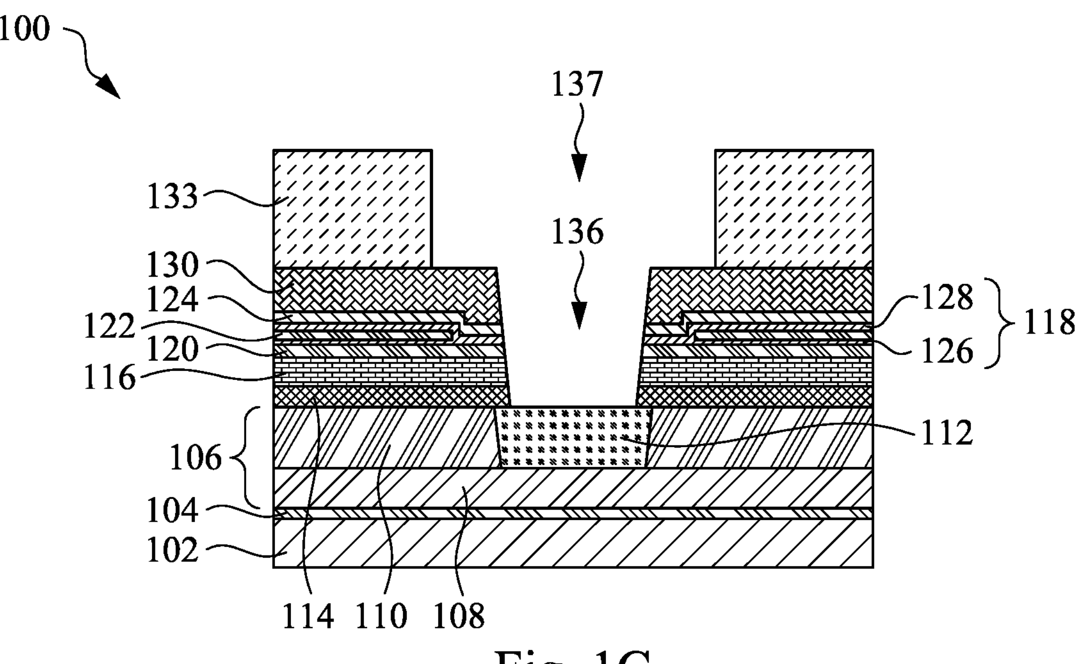

As shown in FIG. 1C, a photoresist layer 133 is formed on the passivation layer 130. The photoresist layer 133 may be first formed in the opening 136 followed by a patterning process to remove the portion of the photoresist layer 133 in the opening 136. The portion of the photoresist layer 133 formed on the portion of the photoresist layer 133 formed in the opening 136 is also removed by the patterning process. As a result, as shown in FIG. 1C, an opening 137 is formed over the opening 136. In some embodiments, the opening 136 is a via opening and the opening 137 is a trench having dimensions much greater than the opening 136.

As shown in FIG. 1D, a barrier layer 138 is formed on the passivation layer 130 and in the opening 136, and a redistribution layer (RDL) 140 is formed on the barrier layer 138 in the openings 136, 137. The barrier layer 138 and the RDL 140 may be also formed on the photoresist layer 133. The portions of the barrier layer 138 and the RDL 140 formed on the photoresist layer 133 may be removed by a planarization process, such as a chemical mechanical polishing (CMP) process. The portion of the barrier layer 138 formed on the sidewall of the photoresist layer 133 may be removed by an etch process after the removal of the photoresist layer 133. The remaining barrier layer 138 is protected by the RDL 140 and not substantially affected by the etch process. In some embodiments, the barrier layer 138 is formed prior to forming the photoresist layer 133 by first forming a blanket layer followed by patterning the blanket layer to form the barrier layer 138 as shown in FIG. 1D.

The barrier layer 138 may prevent diffusion of metal from the RDL 140 into the passivation layer 130 and the dielectric layers 116, 126, 128. As shown in FIG. 1C, the barrier layer 138 is in contact with the passivation layer 130, the MIM structure 118, the dielectric layer 116, the etch stop layer 114, and the conductive feature 112. The barrier layer 138 may include a nitride, such as a metal nitride, for example a refractory metal nitride. In some embodiments, the barrier layer 138 includes an electrically conductive material. In some embodiments, the barrier layer 138 includes tantalum nitride (TaN). The barrier layer 138 may be formed by any suitable process, such as ALD, CVD, or PVD. In some embodiments, the barrier layer 138 is a conformal layer formed by a conformal process. The term “conformal” may be used herein for ease of description upon a layer having substantial same thickness over various regions. In some embodiments, a seed layer (not shown) may be formed on the barrier layer 138 prior to forming the RDL 140, and the RDL 140 is formed on the seed layer. The seed layer may include the same material as the RDL 140.

The RDL 140 may include an electrically conductive material, such as a metal. In some embodiments, the RDL 140 includes Cu. The RDL 140 may extend through the passivation layer 130, the MIM structure 118, and the dielectric layer 116. The RDL 140 may be electrically connected to the conductive feature 112 and the first and third electrode layers 120, 124 of the MIM structure 118. The RDL 140 may be formed by any suitable process, such as PVD or ECP. The RDL 140 includes a bottom portion disposed in the opening 136 (FIG. 1C) and a top portion disposed in the opening 137 (FIG. 1C). In some embodiments, the bottom portion may be a conductive via, and the top portion may be a conductive line.

Figure 1E:
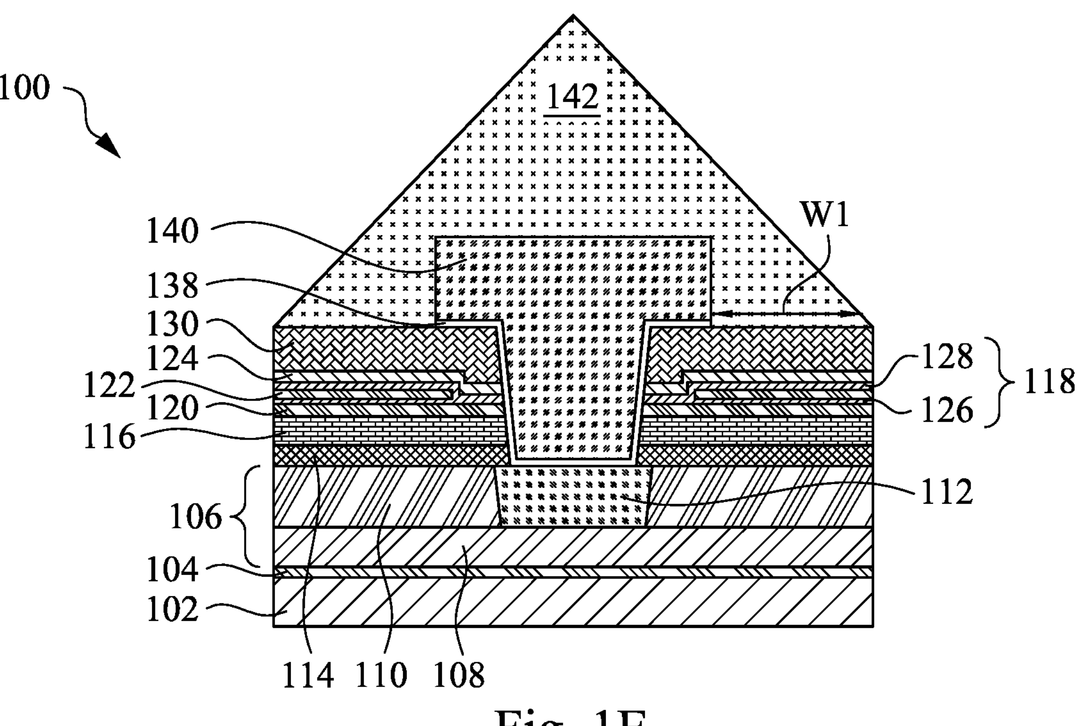
Figures 1, 1F:
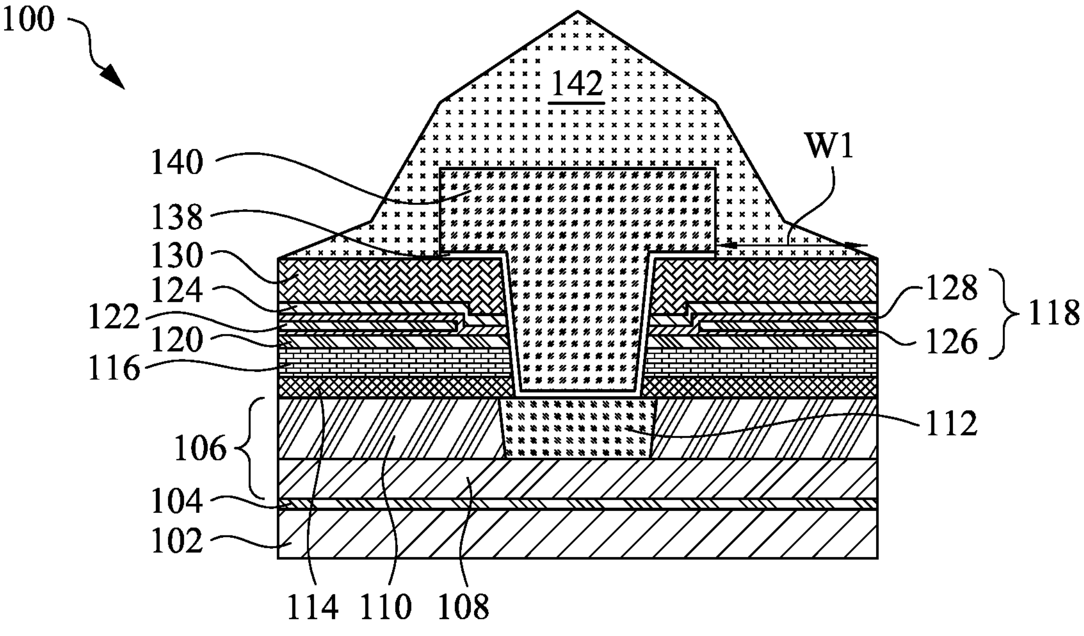

As shown in FIG. 1E, an adhesion layer 142 is formed on the passivation layer 130, the barrier layer 138, and the RDL 140. The adhesion layer 142 is formed by a high-density plasma (HDP) process, and the resulting adhesion layer 142 is non-conformal. For example, the adhesion layer 142 as deposited may have a triangular shape, as shown in FIG. 1E. The adhesion layer 142 includes a portion disposed on the passivation layer 130 adjacent the barrier layer 138, and the portion has a width W1. The portion with the width W1 may function as a mask to protect the bottom portion of the RDL 140 and the MIM structure 118 and to reduce stress in the subsequently formed dielectric material 150 (FIG. 1I). The adhesion layer 142 may include an oxygen-containing dielectric material, such as SiON. The oxygen molecules helps the adhesion layer 142 adhering to the RDL 140.

Portions of the adhesion layer 142 may be removed. FIGS. 1F-1, 1F-2, 1F-3 shows the resulting adhesion layer 142 after different removal processes are performed on the adhesion layer 142. As shown in FIG. 1F-1, a sputter back process is performed on the adhesion layer 142. The portion of the adhesion layer 142 disposed on the RDL 140 is substantially removed, and the portion with the width W1 is not substantially affected by the sputter back process. The sputter back process may be a physical etching process that utilizes a gas such as argon or helium.

Figures 1, 1F, 2:
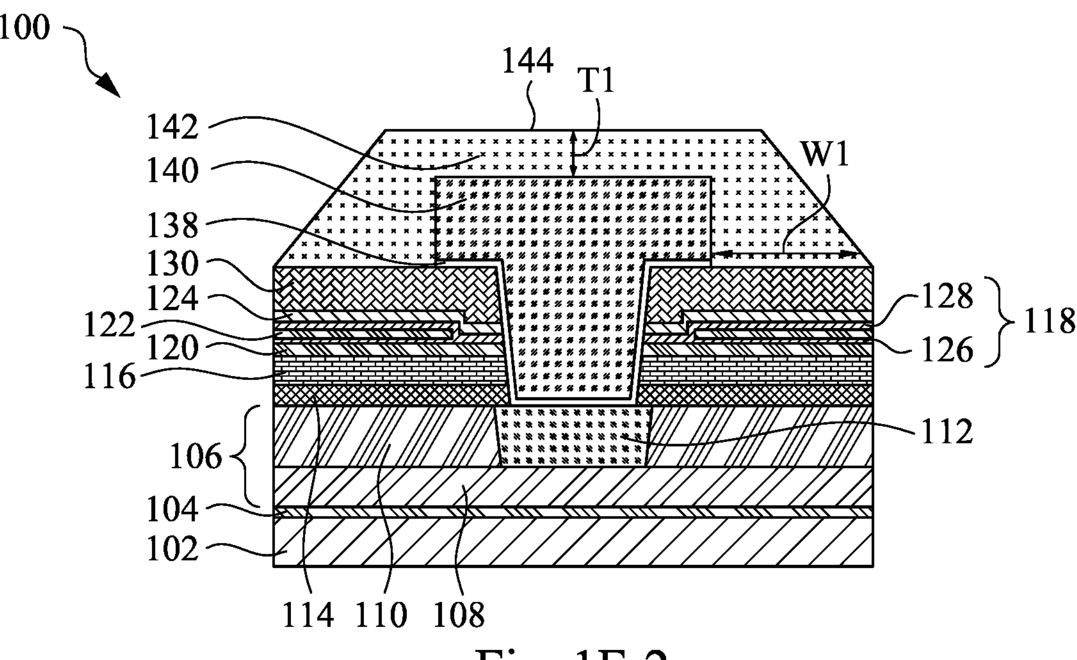
FIG. 2 is a cross-sectional side view of a stage of manufacturing the semiconductor device structure, in accordance with some embodiments.

As shown in FIG. 1F-2, a planarization process is performed on the adhesion layer 142. The planarization process may be a CMP process. As a result, a top surface 144 of the adhesion layer 142 may be substantially planar. The planarization process removes the portion of the adhesion layer 142 disposed over the RDL 140, while the portion of the adhesion layer 142 disposed on the passivation layer 130 is substantially unaffected. Thus, the width W1 of the portion of the adhesion layer 142 is not substantially affected by the planarization process. The planarization process may be stopped after the portion of the adhesion layer 142 disposed on the RDL 140 reaches a thickness T1. In some embodiments, the adhesion layer 142 includes a first portion disposed on a top of the RDL 140 and a second portion disposed over the dielectric layer 116. The first portion has the thickness T1 and the second portion has the width W1. The thickness T1 may be substantially less than the width W1. In some embodiments, the ratio of the width W1 to the thickness T1 may range from about 1.5 to 1 to about 3 to 1. Compared to a conformal adhesion layer, the adhesion layer 142 having a greater width W1 than the thickness T1 can function as a mask to protect the bottom portion of the RDL 140 and to reduce stress in the subsequently formed dielectric material 150 (FIG. 1I). If the ratio of the width W1 to the thickness T1 is less than about 1.5 to 1, the adhesion layer 142 may not function as a mask to protect the bottom portion of the RDL 140 and to reduce stress in the subsequently formed dielectric material 150 (FIG. 1I). On the other hand, if the ratio of the width W1 to the thickness T1 is greater than about 3 to 1, manufacturing cost is increased without significant advantage.

As shown in FIG. 1F-3, an anisotropic etching process is performed on the adhesion layer 142. The anisotropic etching process removes the portion of the adhesion layer 142 disposed over the RDL 140, while the portion of the adhesion layer 144 disposed on the passivation layer 130 is substantially unaffected. Thus, the width W1 of the portion of the adhesion layer 142 is not substantially affected by the anisotropic etching process. The anisotropic etching process may also form the substantially planar top surface 144 and the thickness T1 that is substantially less than the width W1. As described above, the ratio of the width W1 to the thickness T1 may range from about 1.5 to 1 to about 3 to 1.

Figures 1, 1F, 2, 3:
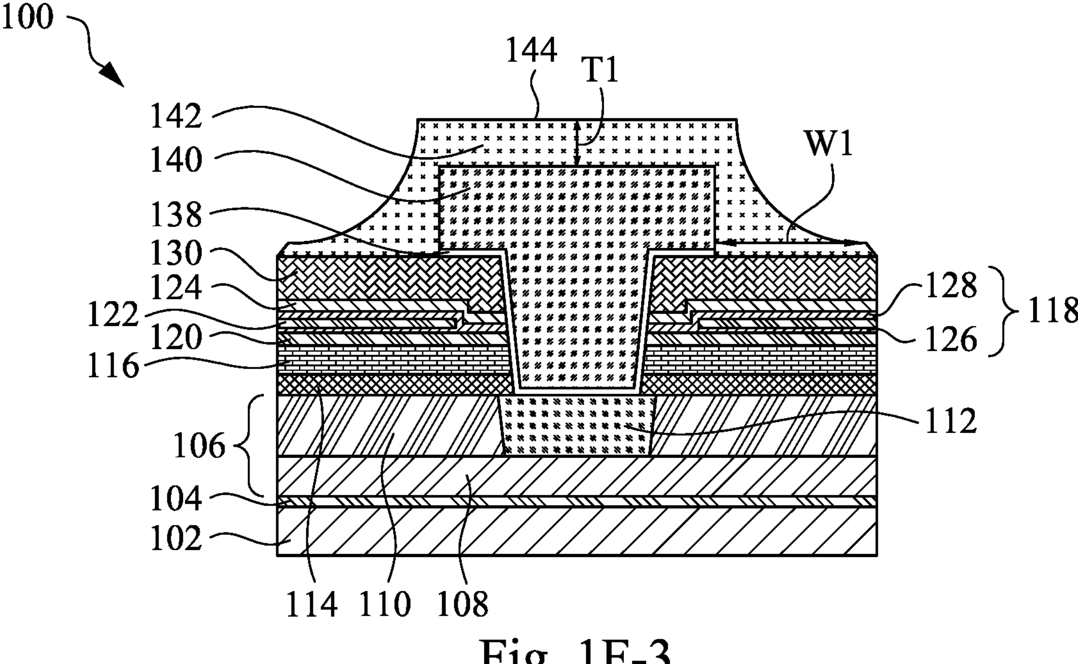
Figure 1G:
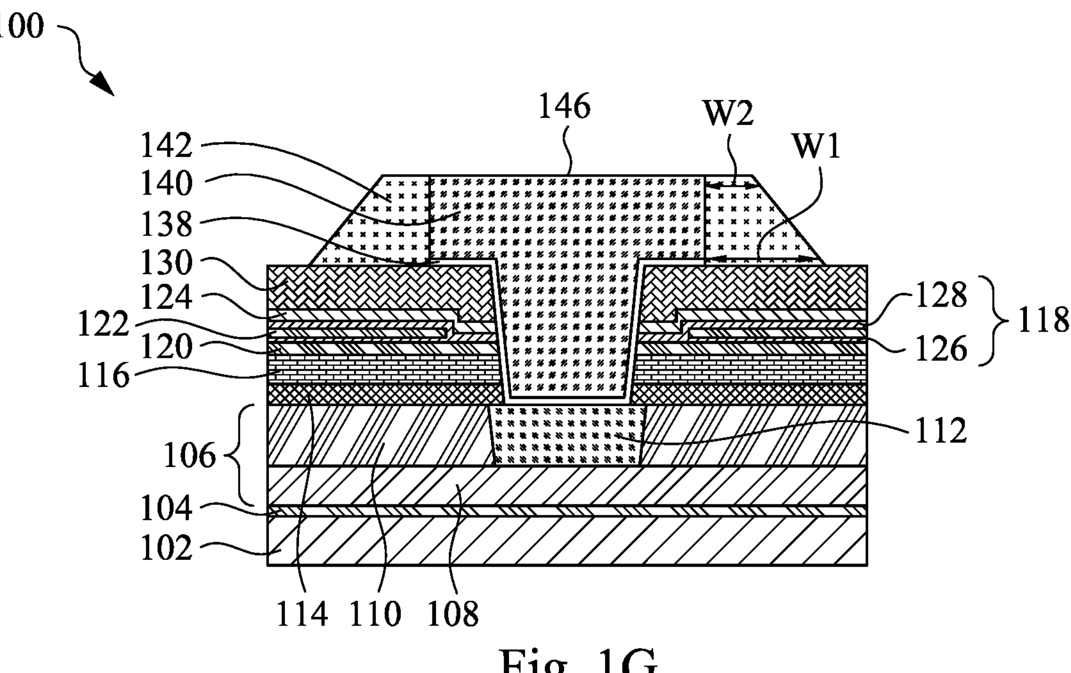

As shown in FIG. 1G, in some embodiments, an anisotropic etching process is performed on the adhesion layer 142 shown in FIG. 1F-1, 1F-2, or 1F-3. As an example, the anisotropic etching process is performed on the adhesion layer 142 shown in FIG. 1F-2. As shown in FIG. 1G, the portion of the adhesion layer 142 disposed on the RDL 140 is removed to expose a top surface 146 of the RDL 140. After the anisotropic etching process, the remaining adhesion layer 142 is disposed on the passivation layer 130 and adjacent the side of the RDL 140. The remaining adhesion layer 142 has the bottom portion disposed on the passivation layer 130 and a top portion. The bottom portion has the width W1 and the top portion has the width W2. The width W1 is substantially greater than the width W2. In some embodiments, the width W1 is about 1.5 to about 3 times greater than the width W2. The remaining adhesion layer 142 may prevent the RDL 140 from delamination. The anisotropic etching process may also remove a portion of the passivation layer 130, and the non-conformal adhesion layer 142 can provide a smooth etching profile of the passivation layer 130. The smooth etching profile of the passivation layer 130 substantially reduces sharp corners in the passivation layer 130, which in turn reduces stress in the passivation layer 130.

In some embodiments, the anisotropic etching process is omitted. In some embodiments, the anisotropic process performed on the adhesion layer 142 shown in FIG. 1F-3 also removes the portion of the adhesion layer 142 disposed on the RDL 140. In other words, one anisotropic etching process is performed after the HDP deposition process to form the remaining adhesion layer 142 as shown in FIG. 1G.

Figure 1H:
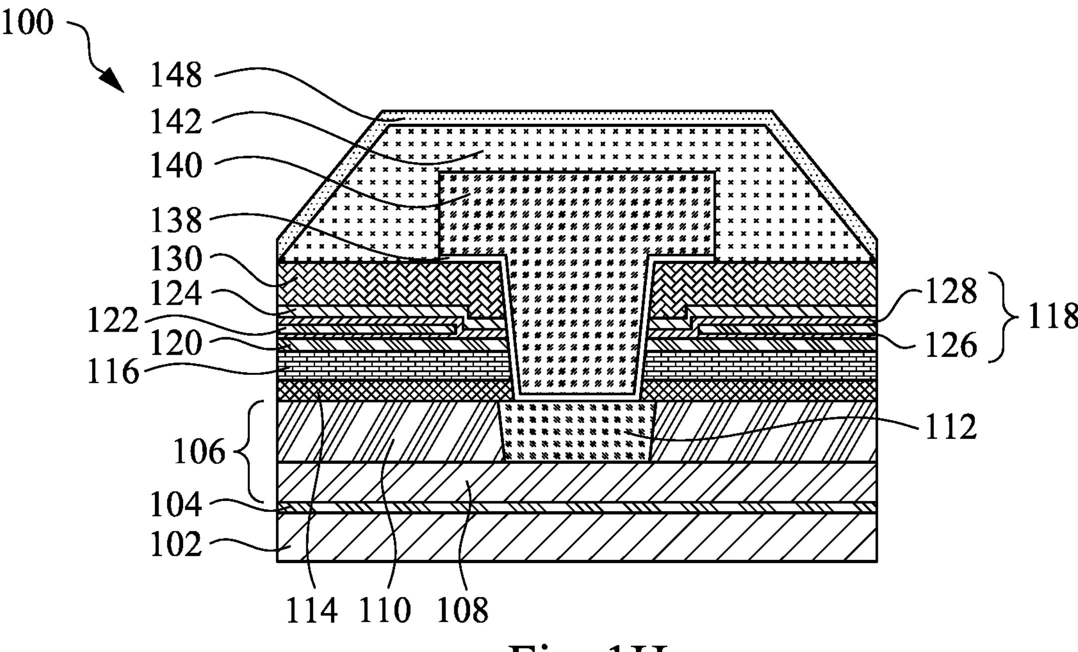
Figure 1I:
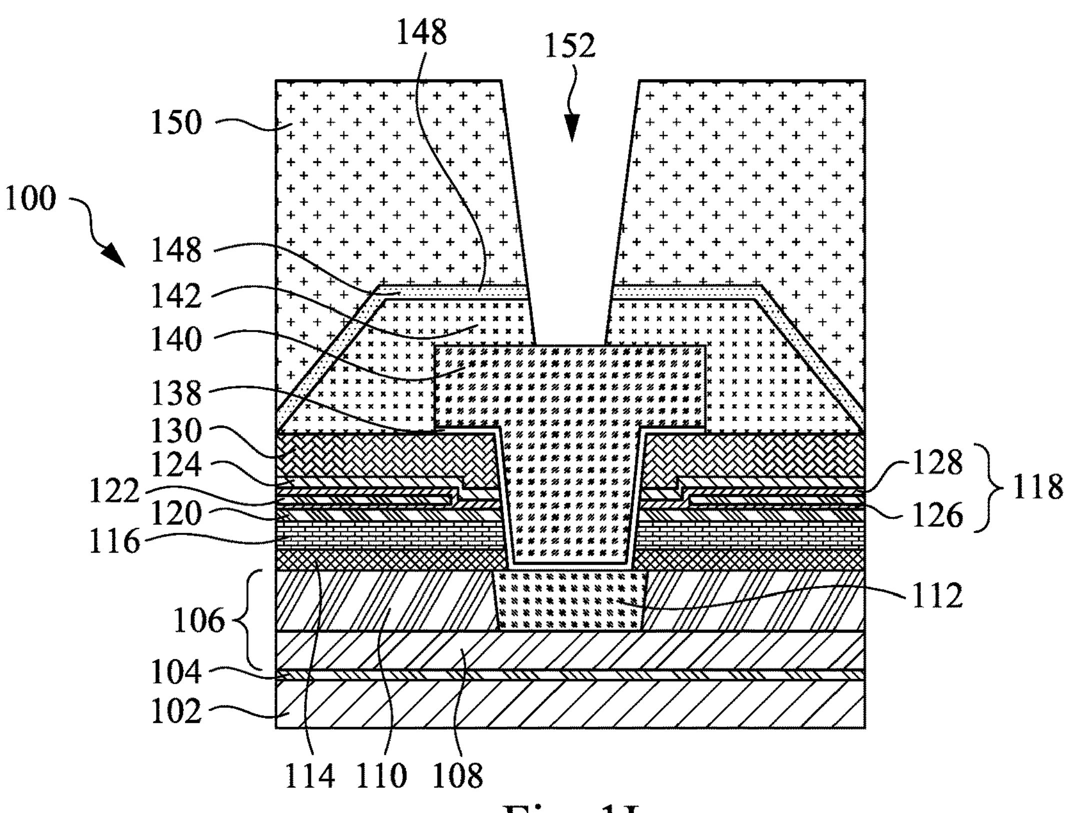

As shown in FIG. 1H, an etch stop layer 148 is formed on the adhesion layer 142. As an example, the etch stop layer 148 is formed on the adhesion layer 142 shown in FIG. 1F-2. The etch stop layer 148 may be formed on the adhesion layer 142 shown in FIG. 1F-1, 1F-3, or 1G. The etch stop layer 148 may include the same material as the etch stop layer 114. In some embodiments, the etch stop layer 148 includes SiN. The etch stop layer 148 may be a conformal layer formed by any suitable process.

As shown in FIG. 1I, a dielectric material 150 is formed on the etch stop layer 148, and an opening 152 is formed in the dielectric material 150, the etch stop layer 148, and the adhesion layer 142 to expose the RDL 140. The dielectric material 150 may be any suitable dielectric material. In some embodiments, the dielectric material 150 is a polymer, such as polyimide. The dielectric material 150 may be formed by any suitable process, such as spin coating, CVD, FCVD, or laminating. The opening 152 may be formed by any suitable process, such as dry etch, wet etch, or a combination thereof. In some embodiments, the opening 152 is a via opening having a depth greater than about 5 microns. The etch process to form the opening 152 may be long due to the large depth, and stress may be induced in the dielectric material 150 that may cause the RDL 140 to delaminate if the adhesion layer 142 is not present. Furthermore, due to the etch stop layer 148 and the adhesion layer 142, over etching of the RDL 140 is substantially reduced.

Figure 1J:
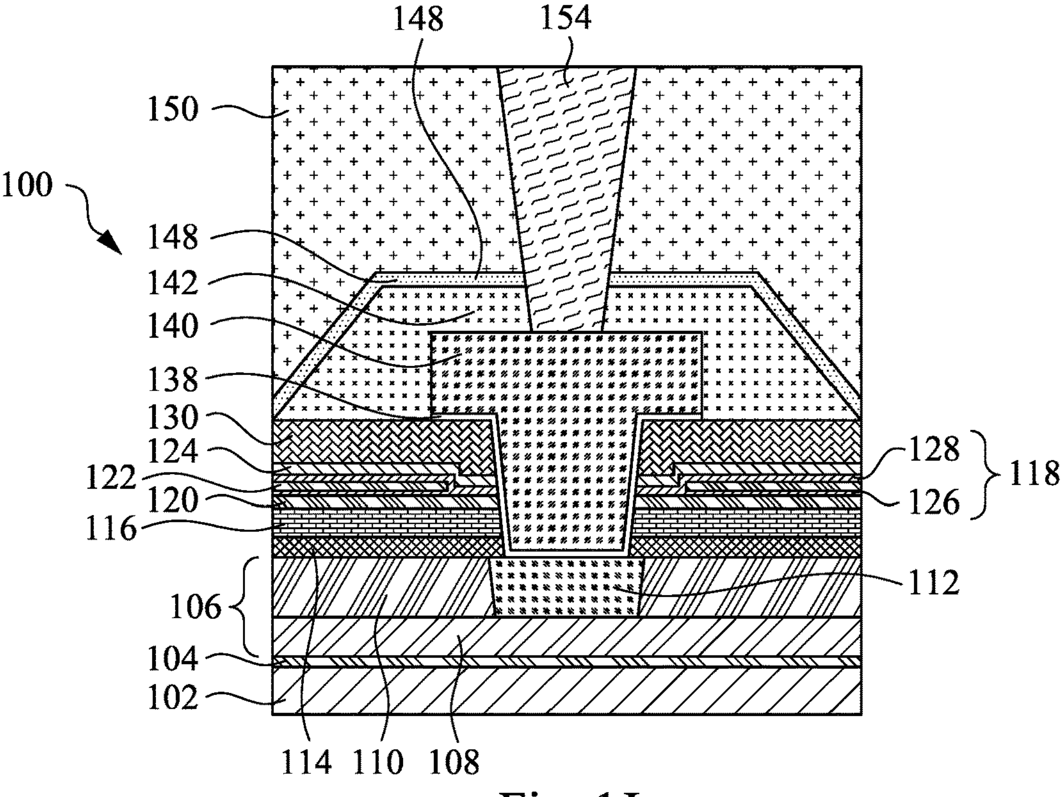
Figure 2:
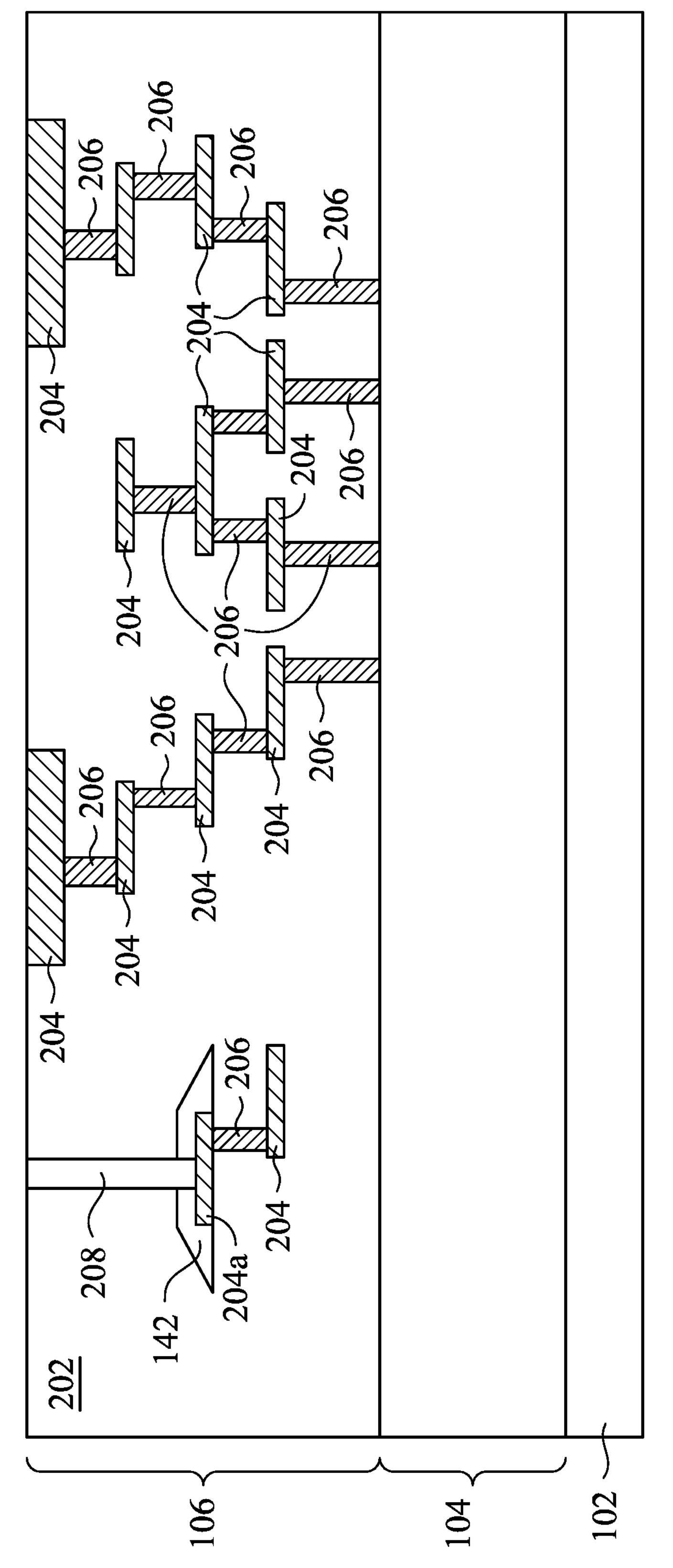

As shown in FIG. 1J, a conductive feature 154 is formed in the opening 152 (FIG. 1I). In some embodiments, the conductive feature 154 may be in contact with the RDL 140. The conductive feature 154 may include an electrically conductive material, such as a metal. In some embodiments, the conductive feature 154 includes Cu, Ni, Au, Ag, Pd, Al, Sn, or other suitable metal. In some embodiments, the conductive feature 154 is a conductive bump.

The adhesion layer 142 may be formed on any conductive feature (e.g., RDL 140) in order to reduce stress in a subsequently formed layer (e.g., dielectric material 150) when forming an opening (e.g., opening 152) on the adhesion layer 142, which leads to reduced risk of delamination of the conductive feature. For example, in some embodiments, as shown in FIG. 2, the semiconductor device structure 100 includes the substrate 102, the device layer 104, and the interconnect structure 106. A plurality of conductive lines 204 and conductive vias 206 are embedded in the interconnect structure 106. In some embodiments, a conductive line **204*a* disposed a distance, such as greater than about 5 microns, away from the top surface of the interconnect structure 106 is electrically connected to a conductive via 208 that extends from the conductive line 204*a* to the top surface of the interconnect structure 106. The adhesion layer 142 may be formed around the conductive line 204*a* in order to prevent the conductive line 204*a* from delamination when forming a via opening for the conductive via 208. In some embodiments, the semiconductor device structure 100 is a die and may be bonded to another die (semiconductor device structure 100**) via hybrid bonding to form three-dimensional integrated circuits (3DICs).

Figure 3A:
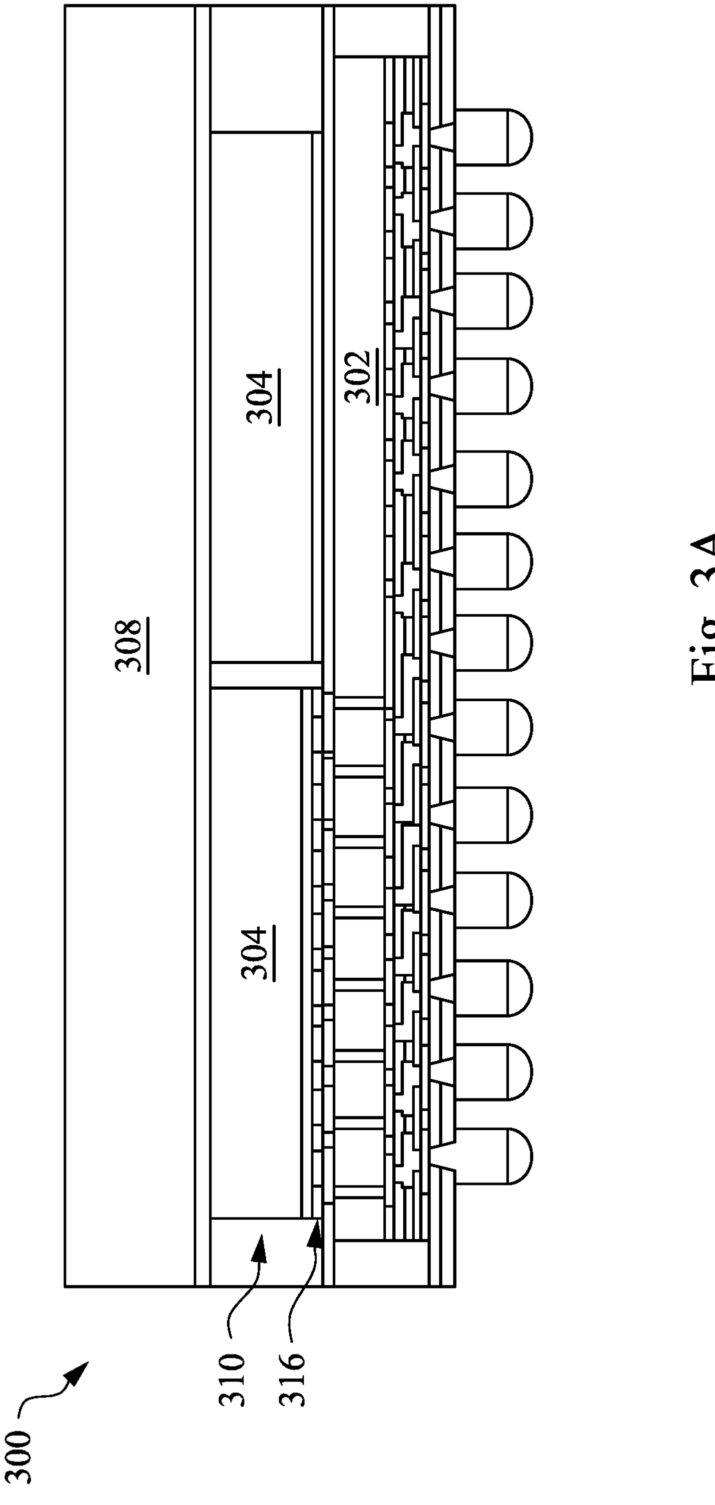
FIGS. 3A and 3B are cross-sectional side views of semiconductor packages, in accordance with some embodiments.
Figure 3B:
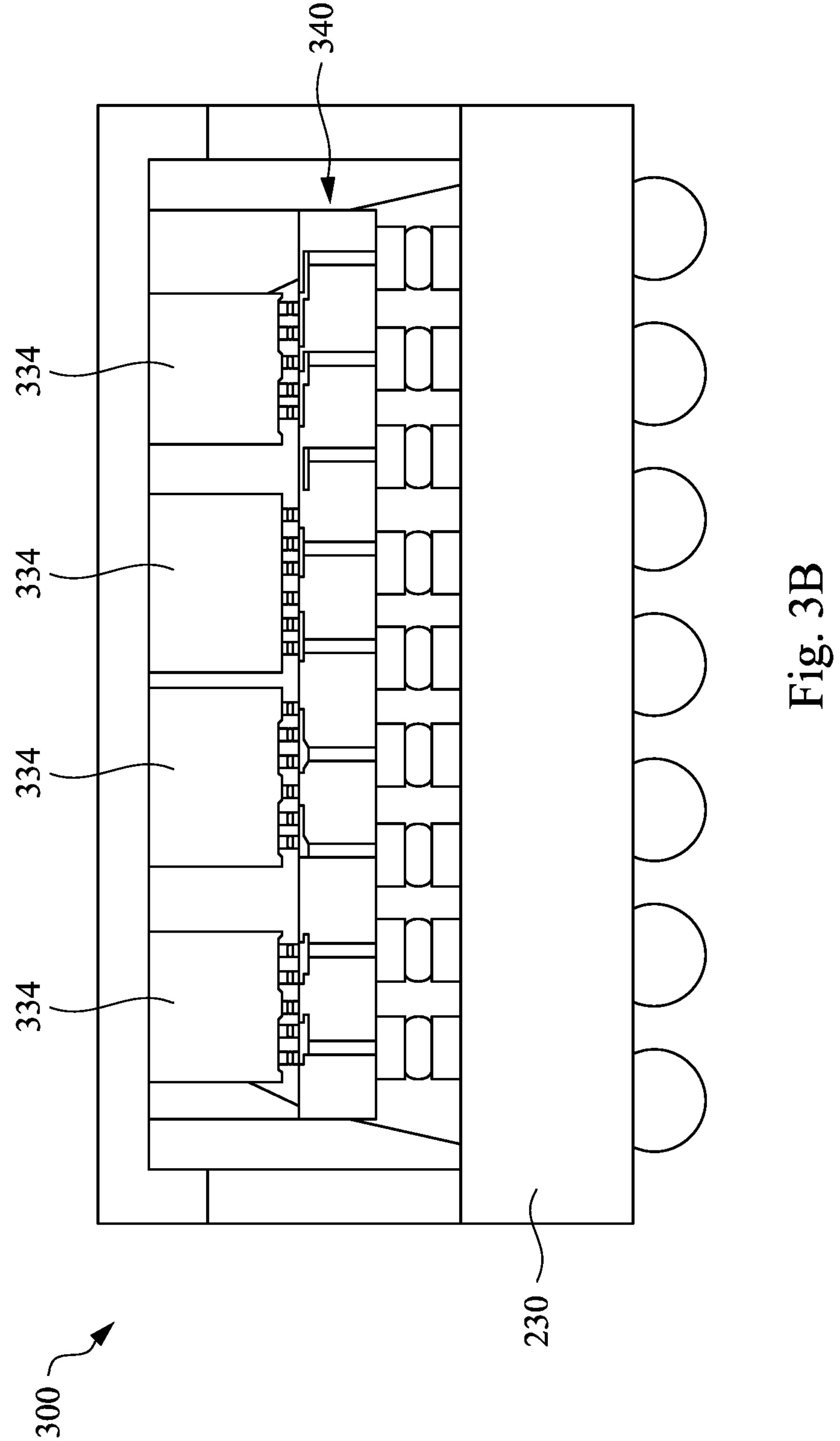

FIGS. 3A and 3B are cross-sectional side views of semiconductor packages 300, in accordance with some embodiments. As shown in FIG. 3A, the semiconductor package 300 may be a system-on-integrated-chip (SOIC) package. The semiconductor package 300 includes a first die 302, a second die 310 disposed over the first die 302, and a third die 306 disposed over the first die 302. In some embodiments, the first die 302 is a central processing unit (CPU) die, the second die 310 is a statis random access memory (SRAM) die, and the third die 306 is a dummy die. The second die 310 includes a substrate 304, a device layer (not shown), and an interconnect structure 316. In some embodiments, the second die 310 is the semiconductor device structure 100 shown in FIG. 1J or in FIG. 2. The substrate 304 may be the substrate 102, the device layer may be the device layer 104, and the interconnect structure 316 may be the interconnect structure 106. The adhesion layer 142 may be formed around one or more conductive features, such as the conductive line 204 (FIG. 2) or the RDL 140 (FIG. 1J), to protect the one or more conductive features from delamination.

As shown in FIG. 3B, the semiconductor package 300 may be a chip-on-wafer-on-substrate (CoWoS) package. The semiconductor package 300 includes a substrate 330, an interposer 340 disposed over the substrate 330, and one or more dies 334 disposed over the interposer 340. In some embodiments, the one or more dies 334 include one or more high bandwidth memory (HBM) dies. In some embodiments, the die 334 is the semiconductor device structure 100 shown in FIG. 1J or in FIG. 2 and may include the adhesion layer 142 formed around one or more conductive features disposed in the interconnect structure of the die 334 to protect the one or more conductive features from delamination.

FIG. 4 is a perspective view of the semiconductor package 300, in accordance with some embodiments. As shown in FIG. 4, the semiconductor package 300 includes a substrate 350, a base die 352 disposed over the substrate 350, and a plurality of dies 354 disposed over the base die 352. Each die 354 may include an interconnect structure 356 disposed between the die 354 and the base die 352. The interconnect structure 356 includes a plurality of conductive features, which are directly bonded to the conductive features formed on the base die 352. FIGS. 5A-5C illustrates various stages of manufacturing the interconnect structure 356, in accordance with some embodiments. As shown in FIG. 5A, an RDL 502 disposed in the interconnect structure 356. The RDL 502 may include the same material as the RDL 140. An adhesion layer 504 is formed on the RDL 502. The adhesion layer 504 may include the same material as the adhesion layer 142 and may be formed by the same process as the adhesion layer 142. A passivation layer 506 is formed to surround the RDL 502 and the adhesion layer 504. An etch stop layer (not shown) may be formed between the adhesion layer 504 and the passivation layer 506.

As shown in FIG. 5B, openings 508 are formed in the passivation layer 506 and the adhesion layer 504 to expose portions of the RDL 502. In some embodiments, the openings 508 are via openings having a depth greater than about 5 microns. The etch process to form the openings 508 may be long due to the large depth, and stress may be induced in the passivation layer 506 that may cause the RDL 502 to delaminate if the adhesion layer 504 is not present. Next, as shown in FIG. 5C, conductive features 510 are formed in the openings 408.

Figure 6A:
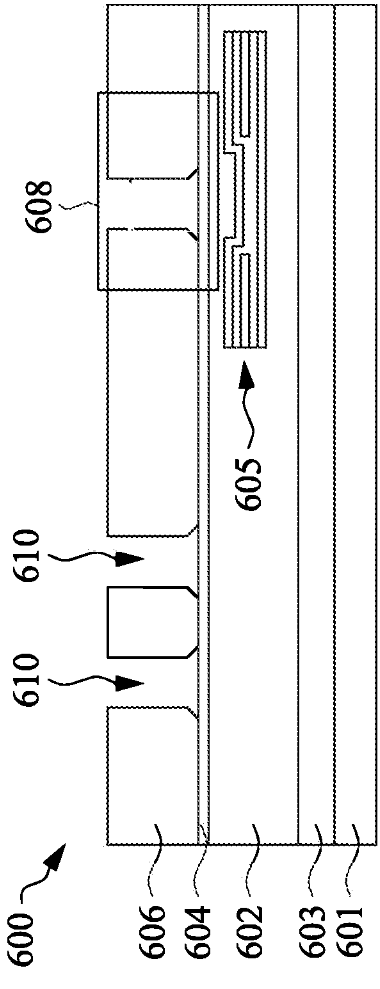
FIGS. 6A-6E are cross-sectional side views of various stages of manufacturing a semiconductor device structure, in accordance with some embodiments.
Figures 1, 6A:
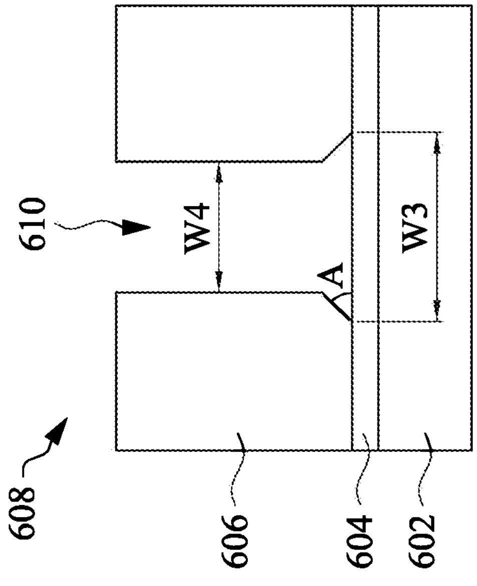

As described above, the adhesion layer 142 (or the adhesion layer 504) can reduce stress by substantially reducing sharp corners in the passivation layer 130. Alternatively, a conductive feature having a footing portion can also reduce stress by substantially reducing sharp corners. With the reduced stress, film cracking is reduced. FIGS. 6A-6E are cross-sectional side views of various stages of manufacturing a semiconductor device structure 600, in accordance with some embodiments. As shown in FIG. 6A, the semiconductor device structure 600 includes a substrate 601, a device layer 603, and an interconnect structure 602 disposed on the device layer 603. In some embodiments, the substrate 601 may be the same as the substrate 102, the device layer 603 may be the same as the device layer 104, and the interconnect structure 603 may be the same as the interconnect structure 106 shown in FIG. 1A. In some embodiments, a MIM structure 605 is embedded in the interconnect structure 602, and the MIM structure 605 may be the same as the MIM structure 118 shown in FIG. 1A. A barrier layer 604 is formed on the interconnect structure 602. The barrier layer 604 may include the same material as the barrier layer 138 (FIG. 1D). A photoresist layer 606 is formed on the barrier layer 604, and openings 610 are formed in the photoresist layer 606. The openings 610 are formed by exposing portions of the photoresist layer 606 to a light, such as EUV light, followed by removing the exposed portions of the photoresist layer 606. In some embodiments, the opening 610 extends through the MIM structure 605, and the opening 610 may be a dual damascene opening.

FIG. 6A-1 is an enlarged portion 608 of FIG. 6A. As shown in FIG. 6A-1, the opening 610 includes a bottom width W3 and a top width W4. The bottom width W3 is substantially greater than the top width W4. In some embodiments, the top width W4 ranges from about 1 micron to about 50 microns, and the bottom width W3 is about 40 nm to about 1000 nm greater than the top width W4. A portion of the photoresist layer 606 form an angle A with respect to the top surface of the barrier layer 604. The angle A is an acute angle. In some embodiments, the angle A ranges from about 10 degrees to about 80 degrees, such as from about 30 degrees to about 70 degrees. If the angle A is less than about 10 degrees, there may not be enough space for the subsequently formed conductive feature 612 (FIG. 6B) to have a footing portion. On the other hand, if the angle A is greater than about 80 degrees, there also may not be enough space for the subsequently formed conductive feature 612 (FIG. 6B) to have the footing portion. The opening 610 with the portion have the width W3 substantially greater than the portion having the width W4 is formed by purposely lower the focus of the light during the exposure process. In some embodiments, the light was focused on a plane located in the center of the photoresist layer 606 along the thickness direction, and the side of the photoresist layer 606 defining the opening 210 may have a substantially constant angle with respect to the barrier layer 604. In other words, the cross-section of the side of the photoresist layer 606 defining the opening 610 may be substantially linear. In some embodiments, the light was focused on a plane located near the bottom of the photoresist layer 606 along the thickness direction, and the side of the photoresist layer 606 defining the opening 610 may have a bottom portion having an angle with respect to the barrier layer 604 substantially different from an angle defined by a top portion of the side of the photoresist layer 606 defining the opening 610 and the barrier layer 604. In other words, the cross-section of the side of the photoresist layer 606 defining the opening 210 may be substantially non-linear, as shown in FIG. 6A-1.

Figure 6B:
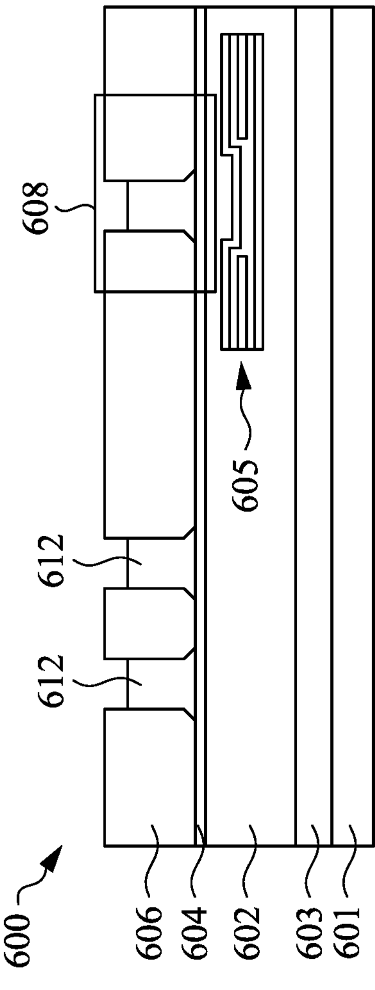
Figures 1, 6B:
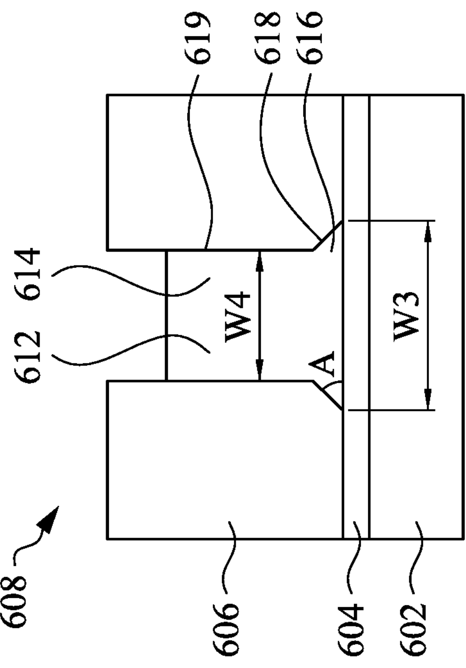

As shown in FIG. 6B, the conductive feature 212 is formed in each opening 610 (FIG. 6A). The conductive feature 612 may include an electrically conductive material, such as a metal. In some embodiments, the conductive feature 612 includes Cu or Al. In some embodiments, the conductive feature 612 is an RDL. The conductive feature 612 may be formed by any suitable process, such as ECP or PVD. The conductive feature 612 may be initially also formed on the photoresist layer 606, and a planarization process, such as a CMP process, is performed to remove the portion of the conductive feature 612 formed on the photoresist layer 606. The planarization process may also cause the top surface of the conductive feature 612 to be at a level lower than the top surface of the photoresist layer 606 due to dishing effect. In the embodiment where the opening 610 extends through the MIM structure 605, the conductive feature 612 is electrically connected to the MIM structure 605.

FIG. 6B-1 is an enlarged portion 608 of FIG. 6B. As shown in FIG. 6B-1, the conductive feature 612 includes a top portion 614 and a footing portion 616. The footing portion 616 is disposed on the barrier layer 604. The top portion 614 has a substantially constant width W4, and the width of the footing portion 616 increases towards the barrier layer 604. The portion of the footing portion 616 in contact with the barrier layer 604 has the width W3, which is substantially greater than the width W4. In some embodiments, the width W3 is about 40 nm to about 1000 nm greater than the width W4. The footing portion 616 includes a slant surface 618 that forms the angle A with respect to the top surface of the barrier layer 604. The angle A may range from about 10 degrees to about 80 degrees, such as from about 30 degrees to about 70 degrees. The top portion 614 includes a side surface 619 that is substantially perpendicular to the top surface of the barrier layer 604 or forms an obtuse angle with respect to the top surface of the barrier layer 604.

Figure 6C:
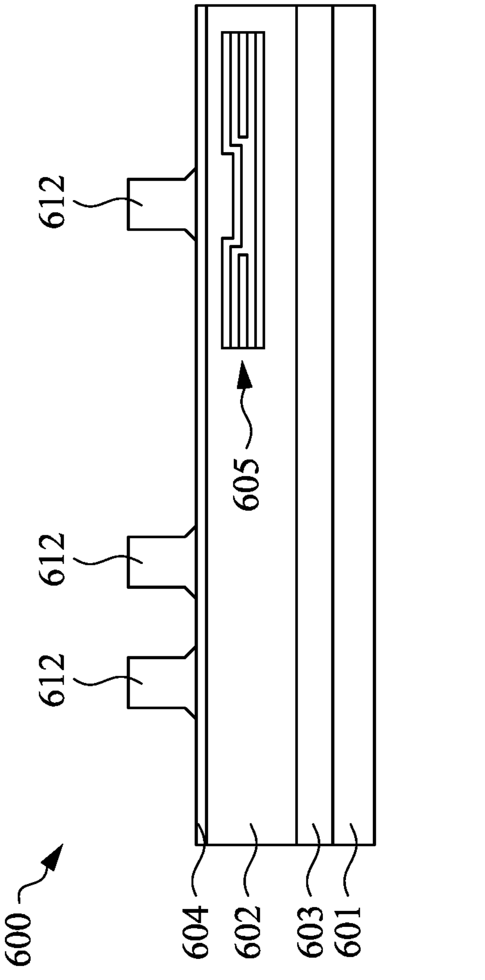

As shown in FIG. 6C, the photoresist layer 606 is removed. The photoresist layer 606 may be removed by any suitable process. In some embodiments, the photoresist layer 606 is removed by stripping. The process that removes the photoresist layer 606 does not substantially affect the conductive features 612 or the barrier layer 604. After the removal of the photoresist layer 606, the conductive features 612 and portions of the barrier layer 604 are exposed.

Figures 1, 6D:
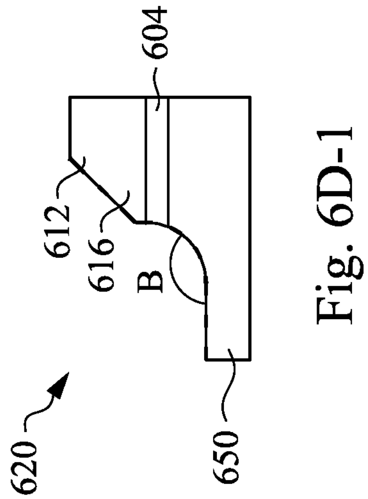
Figures 3, 6D:
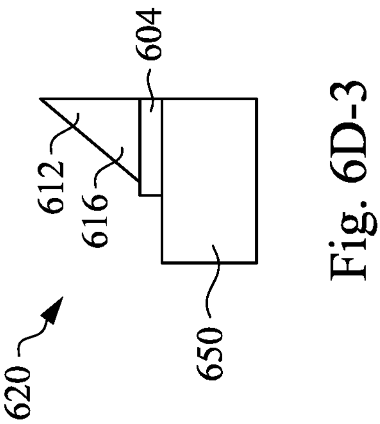
Figure 6D:
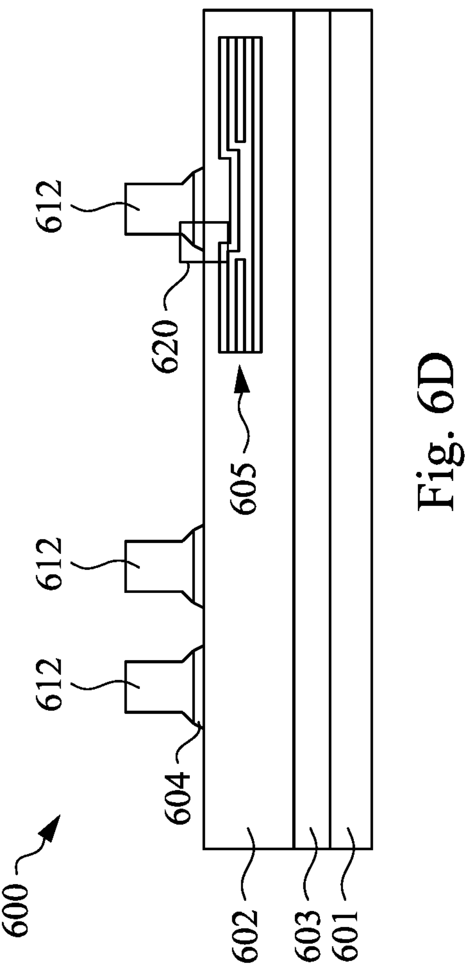
Figures 2, 6D:
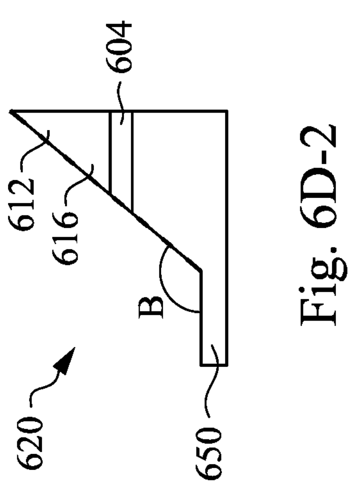

As shown in FIG. 6D, the exposed portions of the barrier layer 604 are removed. The removal of the exposed portions of the barrier layer 604 may be performed by any suitable process. In some embodiments, a dry etching process is performed to remove the exposed portions of the barrier layer 604. FIG. 6D-1 is an enlarged portion 620 of FIG. 6D. As shown in FIG. 6D-1, the interconnect structure 602 includes a layer 650, and the barrier layer 604 is disposed on the layer 650. The layer 650 may be an IMD layer, such as the IMD layer 108 shown in FIG. 1A, or a passivation layer, such as the passivation layer 130 shown in FIG. 1A. A portion of the layer 650 is also removed by the dry etch process that removes the exposed portions of the barrier layer 604. Due to the footing portion 616 of the conductive feature 612, there is no sharp angle formed in the layer 650. As shown in FIG. 6D-1, an obtuse angle B is formed when a portion of the layer 650 is removed. Without the footing portion 616, the angle B may be a right angle, which can lead to increased stress. Thus, with the help of the footing portion 216, stress is reduced, which leads to reduced yield loss and improved reliability.

In some embodiments, a wet etching process is performed to remove the exposed portions of the barrier layer 604. FIG. 6D-2 is an enlarged portion 620 of FIG. 6D according to another embodiment. As shown in FIG. 6D-2, the wet etching process that removes the exposed portions of the barrier layer 604 also removes a portion of the layer 650. Due to the footing portion 616 of the conductive feature 612, the sides of the conductive feature 612, the barrier layer 604, and the layer 650 may have a substantially linear cross-section. Similar to the structure shown in FIG. 6D-1, the angle B formed in the layer 650 shown in FIG. 6D-2 is also an obtuse angle. As a result, stress is reduced.

In some embodiments, a wet etching process is performed to remove the exposed portions of the barrier layer 604, and the layer 650 is not substantially affected. As shown in FIG. 6D-3, which is an enlarged portion 620 of FIG. 6D according to yet another embodiment, the exposed portions of the barrier layer 604 are removed by the wet etching process, and the layer 650 is substantially not affected by the wet etching process.

Figure 6E:
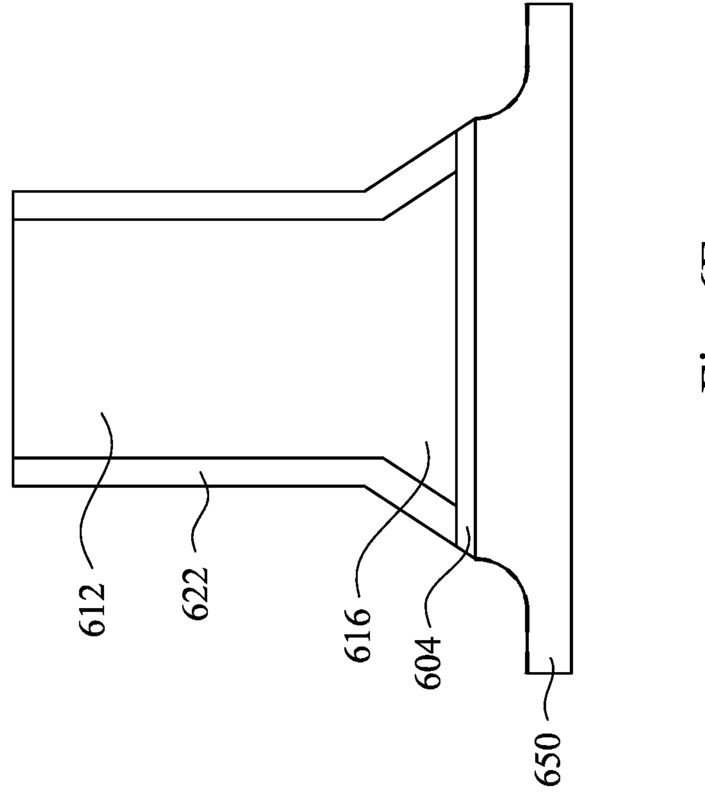

FIG. 6E is an enlarged view of the conductive feature 612. As shown in FIG. 6E, in some embodiments, an adhesion layer 622 is formed on the side of the conductive feature 612. The adhesion layer 622 may be formed by first forming a conformal layer on the exposed surfaces of the semiconductor device structure 600, followed by an anisotropic etching process to remove portions of the conformal layer formed on horizontal surfaces of the semiconductor device structure 600. The adhesion layer 622 may include the same material as the adhesion layer 142 (FIG. 1J). In some embodiments, the adhesion layer 622 disposed on the side of the conductive feature 612 is substantially conformal, as shown in FIG. 6E. In some embodiments, the adhesion layer 622 is formed by the same process as the adhesion 142 in order to further reduce stress. In other words, the adhesion layer 622 may have different widths.

Figure 7B:
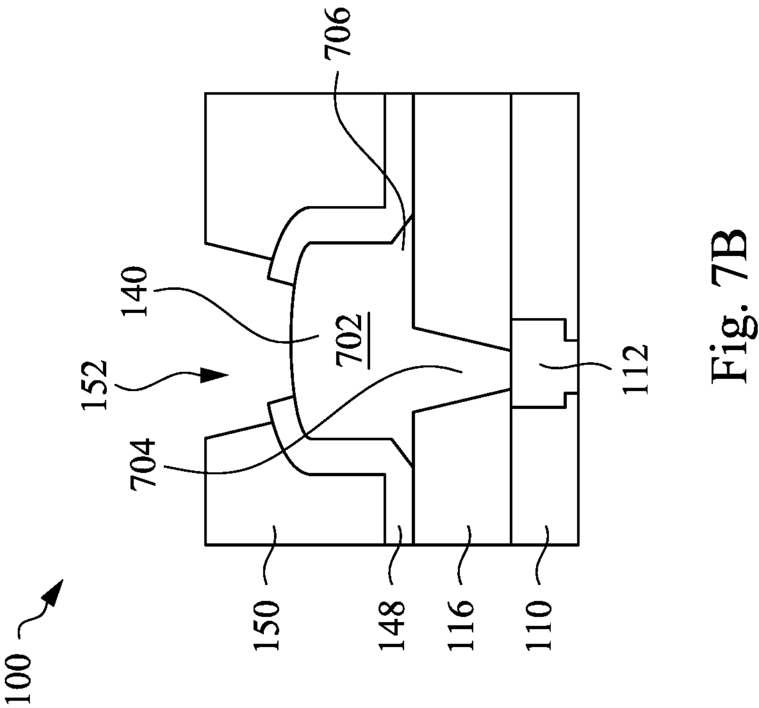
FIGS. 7A and 7B are cross-sectional side views of one of various stages of manufacturing a semiconductor device structure, in accordance with some embodiments.
Figure 7A:
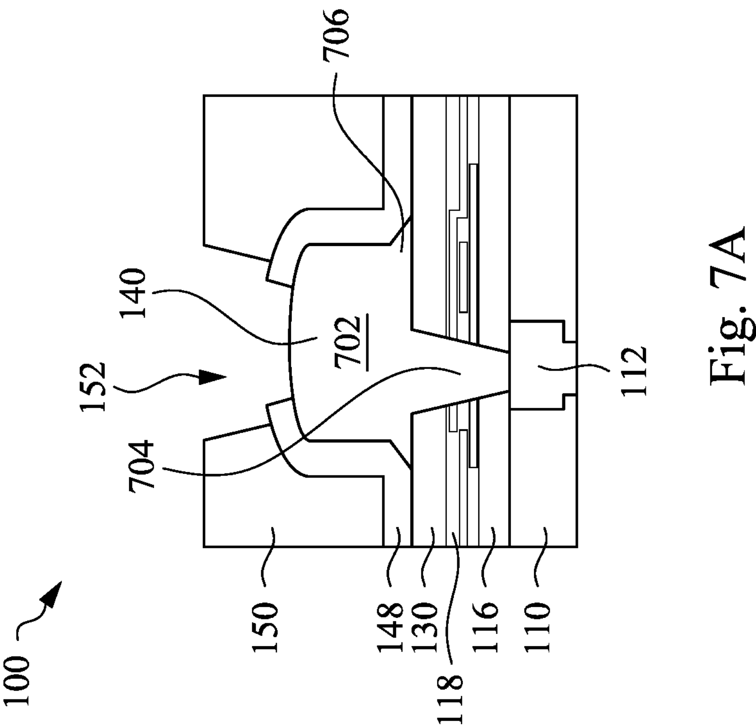

The conductive feature 612 having the footing portion 616 helps to substantially reduce the formation of sharp corners in the layer disposed therebelow. In some embodiments, the conductive feature 612 having the footing portion 616 is utilized in combination with the adhesion layer 142 described in FIGS. 1A-1J. FIGS. 7A and 7B show the RDL 140 formed using the process described in FIGS. 6A-6E. As shown in FIG. 7A, the semiconductor device structure 100 includes the dielectric layer 110, a conductive feature 112 formed in the dielectric layer 110, the dielectric layer 116 disposed on the dielectric layer 110, the MIM structure 118 disposed on the dielectric layer 116, the passivation layer 130 disposed on the MIM structure 118, the RDL 140 disposed on the passivation layer 130 and through the passivation layer 130, the MIM structure 118, and the dielectric layer 116, the etch stop layer 148 disposed on the passivation layer 130 and the RDL 140, and the dielectric material 150 disposed on the etch stop layer 148. The RDL 140 includes a line portion 702 and a via portion 704. In some embodiments, the line portion 702 is a conductive line, and the via portion 704 is a conductive via. The line portion 702 includes a footing portion 706. The line portion 702 may be the conductive feature 612 shown in FIGS. 6A-6E. For example, the line portion 702 has a top portion, such as the top portion 614 (FIG. 6B-1), and a footing portion 706, such as the footing portion 616 (FIG. 6B-1). The adhesion layer 142 (not shown) may be formed on the side of the RDL 140. In some embodiments, the adhesion layer 622 (not shown) is formed on the side of the RDL 140. The opening 152 is formed in the dielectric material 150 and the etch stop layer 148 to expose a portion of the RDL 140.

In some embodiments, as shown in FIG. 7B, the MIM structure 118 is not present. The dielectric layer 116 is disposed on the dielectric layer 110, and the RDL 140 is disposed on the dielectric layer 116 and through the dielectric layer 116. The RDL 140 with the line portion 702 having the footing portion 706 can help reduce stress in the structure, which leads to reduced yield loss and improved reliability. Similar to the adhesion layer 142, the RDL 140 having the footing portion 706 may be utilized in 3DICs or other types of integrated circuit (IC) packaging, such as integrated fan-out package-on package (InFO-POP), flip chip-chip scale package (FCCSP), multi-chip module (MCM) (flip-chip), high-bandwidth package-on-package (HB-POP), flip-chip BGA (FCBGA), or other suitable IC packaging.

The present disclosure in various embodiments provides a semiconductor device structure. In some embodiments, the structure includes an adhesion layer disposed on a conductive feature, and the adhesion layer is a substantially non-conformal layer in order to protect layers disposed therebelow during subsequent etching processes. In some embodiments, a conductive feature includes a footing portion having a width substantially greater than a width of a top portion of the conductive feature. Some embodiments may achieve advantages. For example, the footing portion of the conductive feature substantially reduces the formation of sharp corners in the layer disposed therebelow during subsequent etching processes, which leads to reduced stress. As a result, yield loss is reduced and reliability is improved.

An embodiment is a semiconductor device structure. The structure includes an interconnect structure disposed over a substrate, a first conductive feature disposed in the interconnect structure, a dielectric layer disposed on the interconnect structure, and a second conductive feature having a top portion and a bottom portion. The top portion is disposed over the dielectric layer, and the bottom portion is disposed through the dielectric layer. The structure further includes an adhesion layer disposed over the dielectric layer and the second conductive feature. The adhesion layer includes a first portion disposed on a top of the second conductive feature and a second portion disposed over the dielectric layer, the first portion has a thickness, and the second portion has a width substantially greater than the thickness.

Another embodiment is a semiconductor device structure. The structure includes an interconnect structure disposed over a substrate, a first conductive feature disposed in the interconnect structure, a dielectric layer disposed on the interconnect structure, and a second conductive feature having a line portion and a via portion. The line portion is disposed over the dielectric layer, the via portion is disposed through the dielectric layer, and the line portion includes a top portion having a first width and a footing portion having a second width substantially greater than the first width.

A further embodiment is a method. The method includes forming a barrier layer over a substrate, forming a conductive feature on the barrier layer, forming an adhesion layer on the conductive feature by a high-density plasma process, removing a portion of the adhesion layer until a portion of the adhesion layer disposed on the conductive feature reaches a thickness that is substantially less than a width of a portion of the adhesion layer that is adjacent the barrier layer, forming an etch stop layer on the adhesion layer, and forming a dielectric material on the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

forming a barrier layer over a substrate;

forming a conductive feature on the barrier layer;

forming an adhesion layer on the conductive feature, wherein the adhesion layer is formed by a high-density plasma process;

removing a portion of the adhesion layer until a portion of the adhesion layer disposed on the conductive feature reaches a thickness that is substantially less than a width of a portion of the adhesion layer that is adjacent the barrier layer;

forming an etch stop layer on the adhesion layer; and forming a dielectric material on the etch stop layer.

2. The method of claim 1, wherein the removing the portion of the adhesion layer is performed by a planarization process.

3. The method of claim 1, wherein the removing the portion of the adhesion layer is performed by a sputter back process.

4. The method of claim 1, wherein the removing the portion of the adhesion layer is performed by an anisotropic etching process.

5. A method, comprising:

depositing a barrier layer over an interconnect structure;

depositing a photoresist layer on the barrier layer;

forming an opening in the photoresist layer to expose a first portion of the barrier layer, wherein the opening includes a top portion having a top width and a bottom portion having a bottom width greater than the top width, wherein the top portion is located over the bottom portion;

forming a conductive feature in the opening on the first portion of the barrier layer;

removing the photoresist layer to expose a second portion of the barrier layer; and removing the second portion of the barrier layer.

6. The method of claim 5, wherein the conductive feature comprises a top portion and a footing portion, wherein a width of the footing portion increases in a direction towards the first portion of the barrier layer.

7. The method of claim 5, further comprising performing a chemical mechanical polishing process after forming the conductive feature and prior to removing the photoresist layer, wherein a top surface of the conductive feature is located at a level below a top surface of the photoresist layer.

8. The method of claim 5, wherein a process to remove the second portion of the barrier layer also removes a portion of a dielectric layer located below the second portion of the barrier layer.

9. The method of claim 8, wherein the process is a dry etching process.

10. The method of claim 8, wherein the process is a wet etching process.

11. The method of claim 8, wherein the removal of the portion of the dielectric layer forms an obtuse angle.

12. The method of claim 5, further comprising forming an adhesion layer around the conductive feature.

13. The method of claim 12, wherein the adhesion layer is formed by a high-density plasma process.

14. A method, comprising:

forming an opening through a passivation layer and a metal-insulator-metal structure;

forming a redistribution layer in the opening and over the passivation layer, wherein the redistribution layer comprises a line portion disposed over the passivation layer and a via portion disposed in the opening, and the line portion has a footing portion, wherein a width of the footing portion increases in a direction towards the passivation layer;

forming an adhesion layer on the redistribution layer and the passivation layer, wherein the adhesion layer is formed by a high-density plasma process; and removing a portion of the adhesion layer until a portion of the adhesion layer disposed on the redistribution layer reaches a thickness that is substantially less than a width of a portion of the adhesion layer disposed on the passivation layer.

15. The method of claim 14, wherein a side surface of the adhesion layer is straight.

16. The method of claim 14, wherein a side surface of the adhesion layer is curved.

17. The method of claim 14, further comprising performing an anisotropic etching process on the adhesion layer to expose a top surface of the redistribution layer.

18. The method of claim 17, wherein a remaining adhesion layer located on a side of the redistribution layer has a top portion and a bottom portion, and a width of the bottom portion is greater than a width of the top portion.

19. The method of claim 14, further comprising depositing an etch stop layer on the adhesion layer.

20. The method of claim 19, further comprising depositing a dielectric material on the etch stop layer.

* * * * *